United States Patent
West (10) Patent No.: US 6,949,706 B2
(45) Date of Patent: Sep. 27, 2005

(54) RADIO FREQUENCY SHIELD FOR ELECTRONIC EQUIPMENT

(75) Inventor: David Owen West, San Diego, CA (US)

(73) Assignee: Siemens Information and Communication Mobile, LLC, San Diego, CA (US)

( * ) Notice: Subject to any disclaimer, the term of this patent is extended or adjusted under 35 U.S.C. 154(b) by 266 days.

(21) Appl. No.: 10/154,750

(22) Filed: May 23, 2002

(65) Prior Publication Data

US 2003/0062179 A1 Apr. 3, 2003

Related U.S. Application Data

(63) Continuation-in-part of application No. 09/967,777, filed on Sep. 28, 2001.

(51) Int. Cl.[7] .............................................. H05K 9/00
(52) U.S. Cl. ..................... 174/35 R; 361/816; 220/4.02
(58) Field of Search ......................... 174/35 R, 35 GC; 361/752, 753, 800, 801, 816, 818; 220/4.02

(56) References Cited

U.S. PATENT DOCUMENTS

| | | | |
|---|---|---|---|
| 5,175,395 A | * | 12/1992 | Moore ..................... 174/35 R |
| 5,339,222 A | | 8/1994 | Simmons et al. |
| 5,436,802 A | | 7/1995 | Trahan et al. |
| 5,495,399 A | * | 2/1996 | Gore et al. ................. 361/814 |
| 5,614,694 A | * | 3/1997 | Gorenz et al. ............ 174/35 R |
| 5,844,784 A | | 12/1998 | Moran et al. |
| 5,895,884 A | * | 4/1999 | Davidson .................. 174/35 R |
| 6,136,131 A | | 10/2000 | Sosnowski |
| 6,320,121 B1 | | 11/2001 | Honeycutt et al. |
| 6,377,472 B1 | * | 4/2002 | Fan ........................... 361/800 |
| 6,377,475 B1 | | 4/2002 | Reis |

FOREIGN PATENT DOCUMENTS

| | | |
|---|---|---|
| GB | 2 285 181 A | 6/1995 |
| JP | 283297 | 8/1996 |
| JP | 484796 | 4/2002 |

* cited by examiner

Primary Examiner—Dean A. Reichard
Assistant Examiner—Carmelo Oliva (57) ABSTRACT

A device for providing radio frequency shielding is disclosed. The device includes a frame and cover removably attached to the frame. The frame is configured to extend generally around the periphery of an electronic component. The frame has an upper wall, sidewalls depending therefrom, and a plurality of stiffening flanges extending from the upper wall towards an interior portion of the frame. The cover has an upper surface and a plurality of members extending therefrom for engagement with the sidewalls of the frame. The cover and the frame form an enclosure for radio frequency shielding the electronic component.

26 Claims, 7 Drawing Sheets

RADIO FREQUENCY SHIELD FOR ELECTRONIC EQUIPMENT

CROSS-REFERENCE TO RELATED APPLICATION

The present invention is a continuation-in-part application of U.S. application Ser. No. 09/967,777 listing inventors David Owen West and Michael Berner and filed on Sep. 28, 2001.

BACKGROUND OF THE INVENTION

The present invention relates generally to shielding systems for electrical components, and more specifically, to a radio frequency shielding device for a printed circuit board.

Radio frequency shielding in electronic equipment such as mobile telephones, is required to reduce receiver radio frequency interference from digital circuit switching noise and to prevent malfunction of the digital circuits due to locally transmitted radio frequency signals. Conventional shielding devices include a frame soldered on a printed circuit board and a cover attached to the frame. The frame is typically placed onto the printed circuit board along with the electronic components using standard SMD (Surface Mounting Devices) pick-and-place technology equipment on the production line before the printed circuit board goes through re-flow soldering. Optical inspection is then performed to ensure proper placement of the components. After the optical inspection is passed, a functional electrical test is performed on the printed circuit board. If the functional electrical test is passed, a separate shield cover is mechanically placed onto the frame.

Mechanical assembly of the cover onto the frame after re-flow soldering and testing may cause bending of the printed circuit board and excessive stresses within the board. These stresses may damage the printed circuit board conductors, connections, or components and lead to premature failure of the circuit board. Furthermore, signal leakage may occur during testing since the shield cover has not yet been inserted onto the frame.

The frame is commonly formed by stamping a metal plate that is typically thin. This often results in a frame which bends or bows after the cover is attached. The bending or bowing of the frame may result in the metal frame contacting internal components of the printed circuit board which can lead to electrical shorting of components of the circuit board. Manufacturers sometimes increase the cross-sectional thickness of the entire frame in an attempt to reduce bending of the frame. However, the thicker cross-section requires more material and provides minimal stiffness towards the center of the frame edges. Also, the increased cross-section does not add material to the corners of the frame which often exhibit twisting under load from the cover.

Another drawback with conventional frame designs is that the corners of the stamped parts do not typically provide sufficient shielding for high frequency signals. This is a result of the large gaps present in the frame corners due to design and stamping process limitations.

There is therefore a need for a shielding device that provides a frame with increased stiffness and corners designed to maximize contact between the frame and cover to reduce the occurrence of high frequency signals entering or escaping from the shielding device.

SUMMARY OF THE INVENTION

In a specific embodiment, the invention provides device providing radio frequency shielding. The device generally includes a frame and cover removably attached to the frame. The frame is configured to extend generally around the periphery of an electronic component. The frame has an upper wall, sidewalls depending therefrom, and a plurality of stiffening flanges extending from the upper wall towards an interior portion of the frame. The cover has an upper surface and a plurality of members extending therefrom for engagement with the sidewalls of the frame. The cover and the frame form an enclosure for shielding the electronic component.

In another aspect of the invention, the sidewalls are configured such that any gap between adjacent sidewalls is less than a dimension corresponding to a wavelength of frequency of operation. The cover has an upper surface and a plurality of spring members extending therefrom for engagement with the frame, and a plurality of alignment members located at corners of the cover. The cover and frame form an enclosure for shielding the electronic component and have at least two grounding contact points at each of the corner interfaces between the frame and the cover.

These and other specific embodiments of the invention, as well as its features and advantages, will be apparent to those skilled in the art from the following description and drawings, wherein corresponding reference characters indicate corresponding parts throughout the several views.

DETAILED DESCRIPTION OF SPECIFIC EMBODIMENTS

The following description is presented to enable one of ordinary skill in the art to make and use the invention. Descriptions of specific embodiments and applications are provided only as examples and various modifications will be readily apparent to those skilled in the art. The general principles described herein may be applied to other embodiments and applications without departing from the scope of the invention. Thus, the present invention is not to be limited to the embodiments shown, but is to be accorded the widest scope consistent with the principles and features described herein. For purpose of clarity, details relating to technical material that is known in the technical fields related to the invention have not been described in detail.

Figure 1:
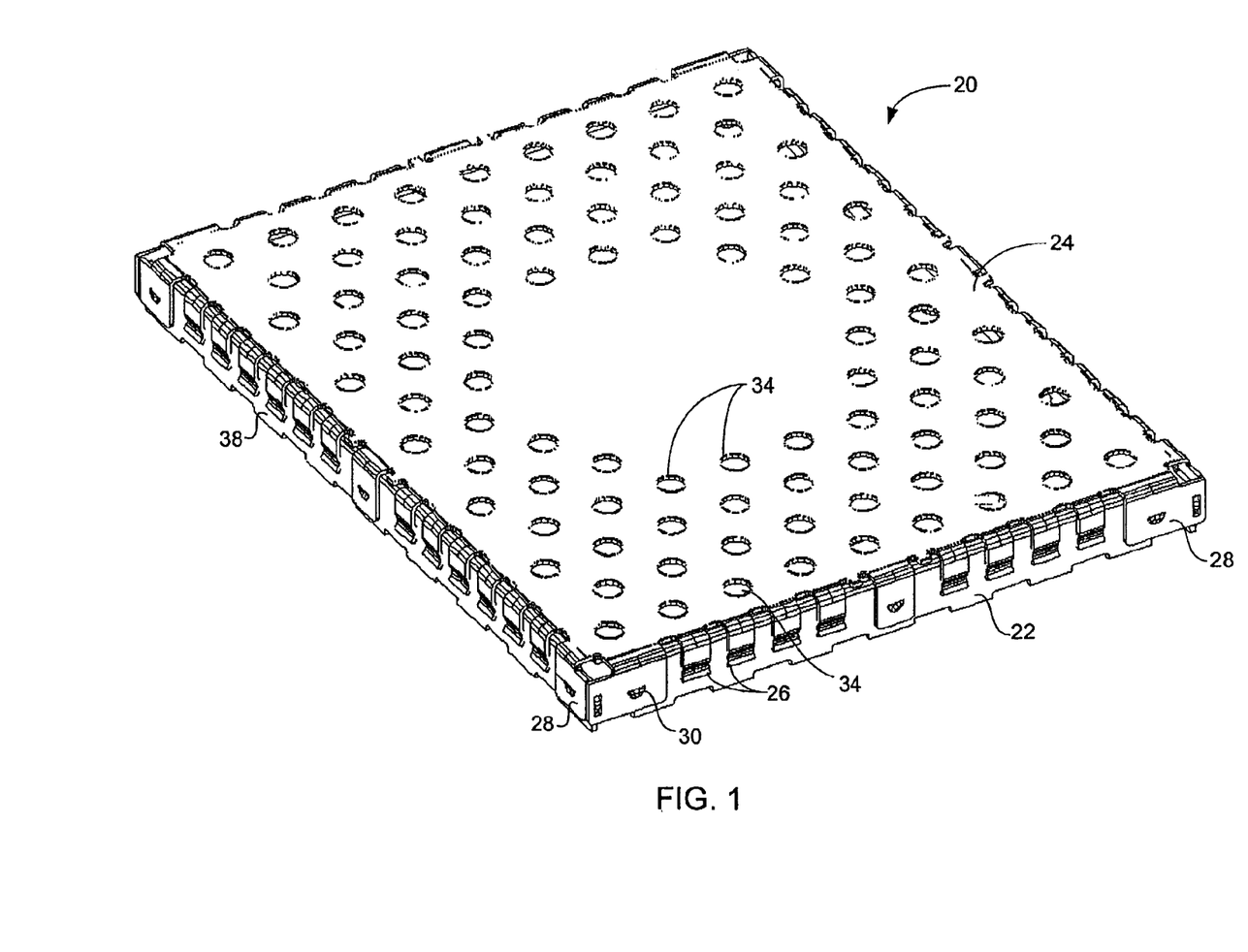
FIG. 1 is a perspective of a shielding device according to an exemplary embodiment of the present invention.
Figure 2:
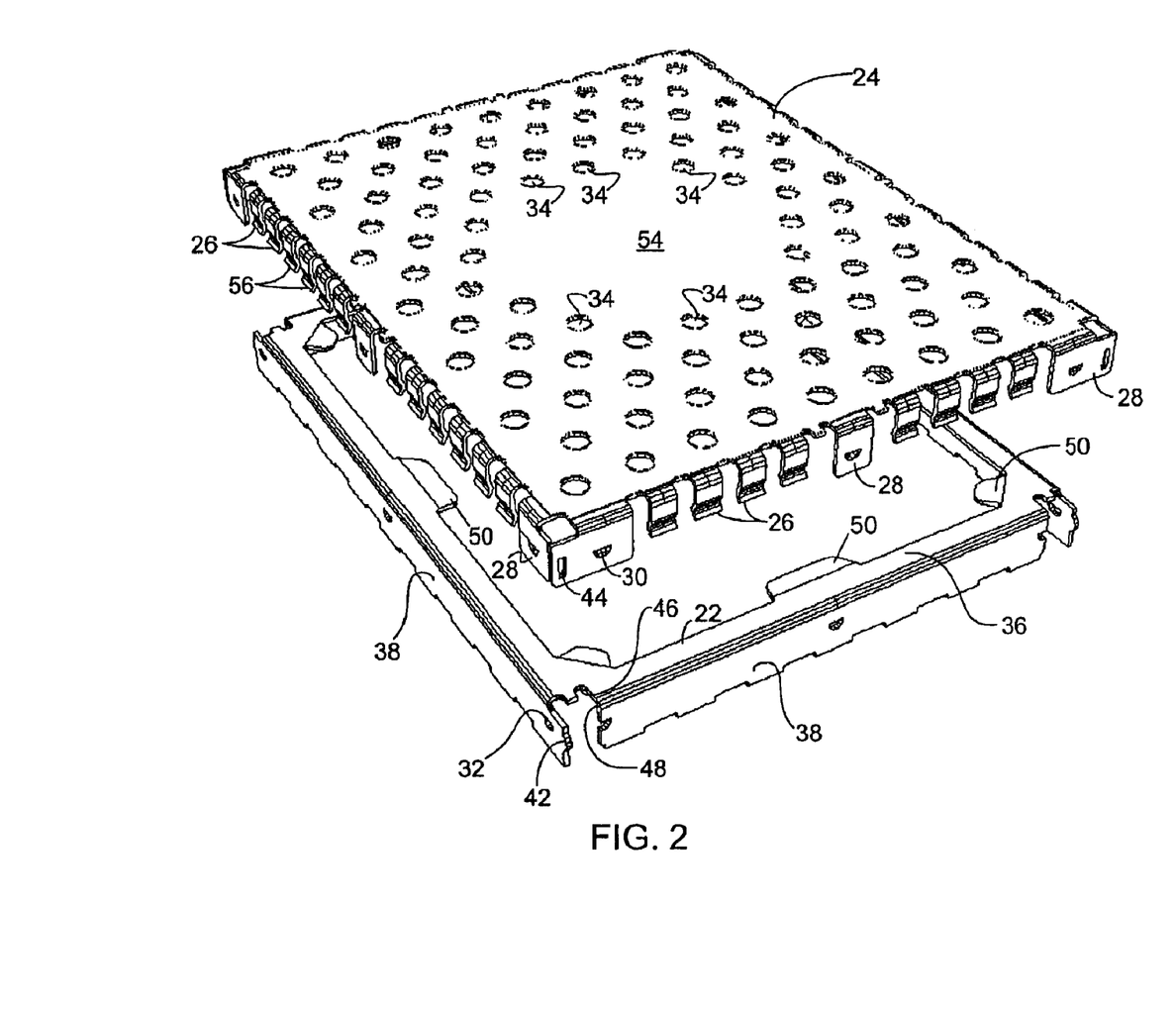
FIG. 2 is an exploded view of the shielding device of FIG. 1.

Referring now to the drawings, and first to FIG. 1, a radio frequency shielding device is shown and generally indicated at 20. The device 20 is used for shielding at least one electronic component, and may be used, for example, to shield electrical circuits of one or more printed circuit boards or any other electronic components that require shielding. The shielding device 20 generally provides a radio frequency tight enclosure with a cover that can be easily removed and replaced if access to the electrical components contained within the device is required. The shielding device 20 includes a frame 22 and cover 24 configured for placement over the frame. The frame 22 extends generally around the periphery of the electronic component, and the cover 24 and frame 22 form an enclosure for shielding the electronic component. As described below, the cover 24 includes a plurality of spring members 26 configured for engagement with the frame 22 and a plurality of alignment members 28 having projections 30 sized for insertion into aligned openings 32 in the frame for securely attaching the cover 24 to the frame 22 (FIGS. 1 and 2). The cover 24 includes a plurality of openings 34 which allow for optical inspection of the printed circuit board and components without having to remove the cover from the frame 22. The openings 34 are preferably smaller than a wavelength of the highest frequency typically encountered during operation. As used herein, 'frequency of operation' generally refers to those frequencies to which the device is expected to be exposed during operation. These frequencies include any potential interfering signal regardless of where the interfering signal originates. The shielding device 20 is preferably fully assembled before being placed on the printed circuit board so that no stress is applied to the printed circuit board during assembly of the shielding device. The spring members 26 and alignment members 28 allow for removal of the cover (if required to rework the printed circuit board) with a minimal amount of bending stress to the printed circuit board.

Figure 3:
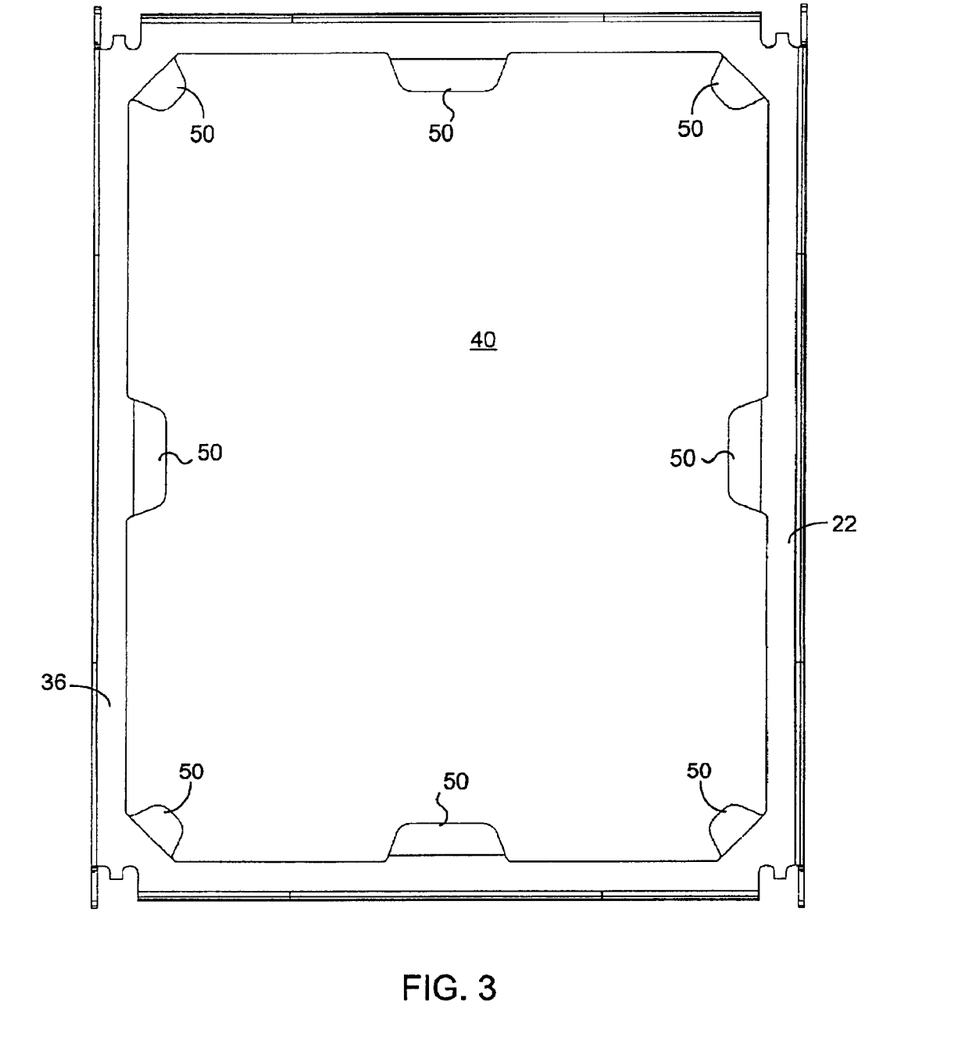
FIG. 3 is a plan view of a frame of the shielding device of FIG. 1.
Figure 4:
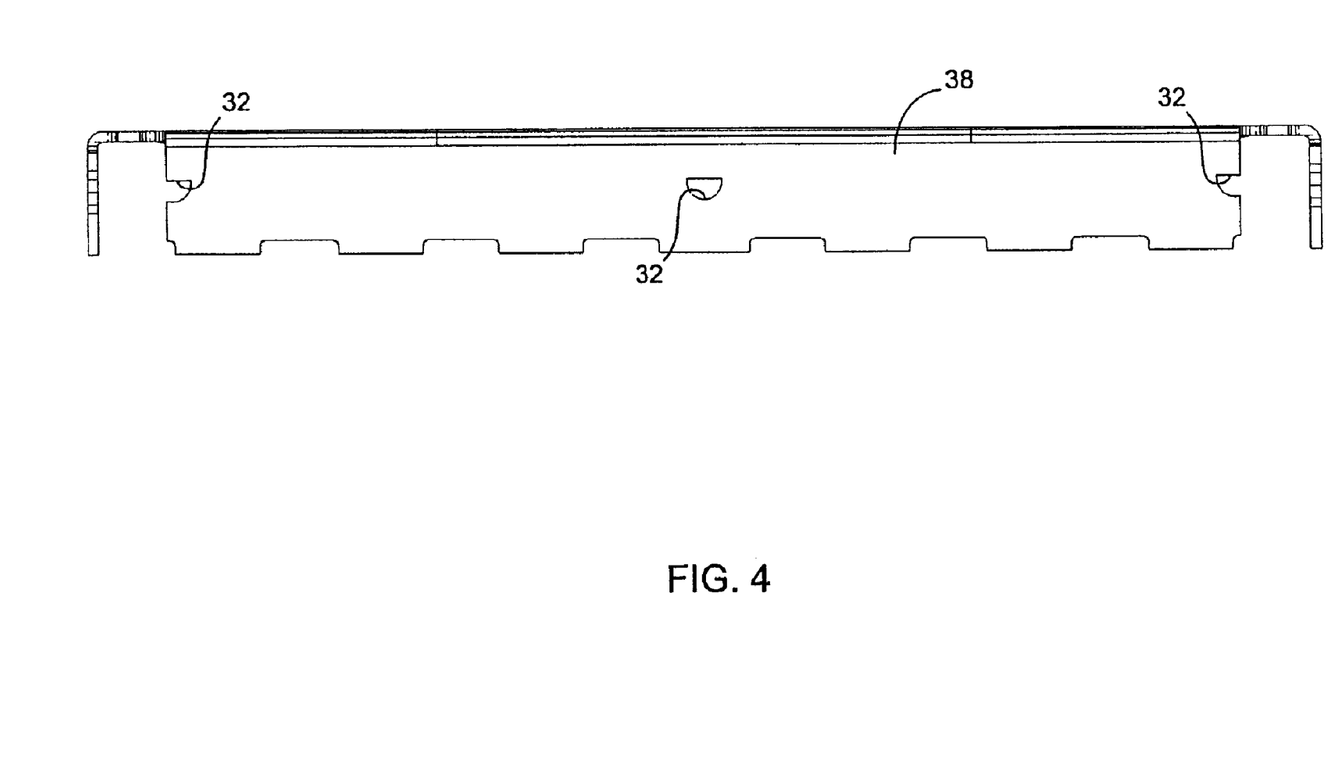
FIG. 4 is a first side view of the frame of FIG. 3.

FIGS. 2–5 illustrate one embodiment of a frame 22 of the shielding device 20. The frame 22 includes an upper wall 36 and four sidewalls 38 depending downwardly from outer edges of the upper wall. The frame 22 shown herein for illustrative purposes is square or rectangular, however, any shape may be used. The frame 22 defines a central opening 40 for receiving electrical components (e.g., printed circuit boards) (FIGS. 2 and 3). The sidewalls 38 are configured so that they can be re-flow soldered to a conductive area of the printed circuit board (not shown). The upper wall 36 extends generally parallel to an upper surface of the cover 24 when the cover is positioned over the frame 22. The sidewalls 38 to extend slightly outward (i.e., away from the central opening 40) from the upper wall 36 at an angle of approximately 91 degrees to provide sufficient spring contact with spring members 26 of the cover 24, as described further below.

The sidewalls 38 include openings (alignment-receiving elements) 32 sized for receiving projections 30 extending inwardly from alignment members 28 of cover 24 (see FIG. 7 and corresponding description below). As shown in FIGS. 1, 2, 4, and 5, the openings 32 are located at generally the center and end portions of the sidewalls 38. The openings 32 located in the frame edge centers and openings 32 located on end portions on two of the sidewalls 38 are in the shape of a semi-circle (FIG. 5), according to a specific embodiment. The openings disposed at the end portions of the other two sidewalls 38 are quarter circles (FIG. 4), according to the specific embodiment. It is to be understood that the openings 32 may have shapes different than shown and described herein and may be disposed at different locations along the frame, without departing from the scope of the invention. Also, the openings 32 may extend only partially through the frame (e.g., indentations or dimples formed in the metal). Two of the sidewalls 38 (FIG. 5) further include tabs 42 sized for insertion into a slot 44 formed in the cover (see FIG. 7 and corresponding description below). The tab 42 and corresponding slot 44 and the projections 30 and corresponding openings 32 located at each corner of the frame 22 provide three points of contact between the frame and cover 24 to provide a ground therebetween at the corners of the to shielding device 20.

The opening 48 formed at the corner of the frame 22 due to the stamping process is designed so that there is overlap between the cover and frame at the corners to further minimize leakage of high frequency signals (FIG. 1). The openings at the corners of the frame may be, for example, less than about 1.97 mm in length for electrical components in an operating frequency environment of about 1900 MHz (e.g., high frequency GSM (Global System for Mobile Communications) in the U.S.). The gap and grounding contacts may also be sized for use in other environments such as about 2100 MHz range for high frequency UMTS (Universal Mobile Telecommunications System). A strip cut 46 is preferably formed in the upper wall 36 at each corner of the frame 22.

The frame 22 also includes eight stiffening flanges 50 extending inwardly towards the interior space 40 of frame 22 from a central portion of each edge of the frame and each corner of the frame (FIGS. 2 and 3). The flanges 50 extend slightly downward (i.e., towards the side walls 38) at an angle of approximately 10–20 degrees relative to the upper wall 36. In a preferred embodiment, the flanges 50 extend at an angle of 15 degrees relative to the upper wall 36. The flanges 50 provide additional. stiffness to frame 22 to prevent twisting of the frame and help in maintaining co-planarity of the frame. In one embodiment, the edge flanges 50 have a length of approximately 4.0 mm and width of approximately 1.3 mm, for a frame having dimensions of approximately 24 mm×29 mm; and the corner flanges may have a length of approximately 1.85 mm and a width of approximately 1.1 mm. The flanges 50 are preferably generally planar with a constant thickness. The thickness of the flange is preferably the same as the upper wall 36 (e.g., 0.20 mm). As shown in FIG. 3, the sides of the flange may be tapered in a direction away from the upper wall. It is to be understood that the shape and size of the flanges 50 shown and described herein are illustrative as an example and that other shapes and sizes may be used. Also the flanges 50 may be located only along the edges of the frame 22 and not at the corners.

Figure 6:
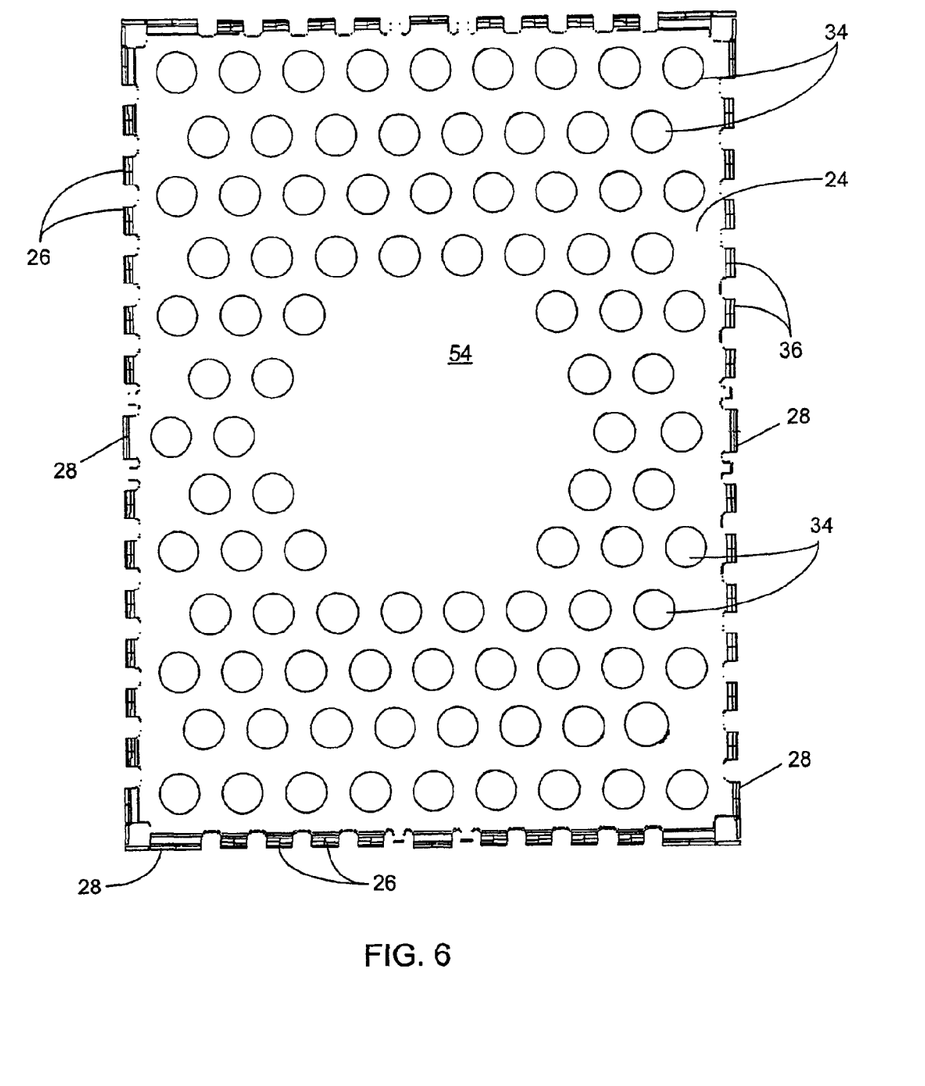
FIG. 6 is a plan view of a cover of the shielding device of FIG. 1.
Figure 7:
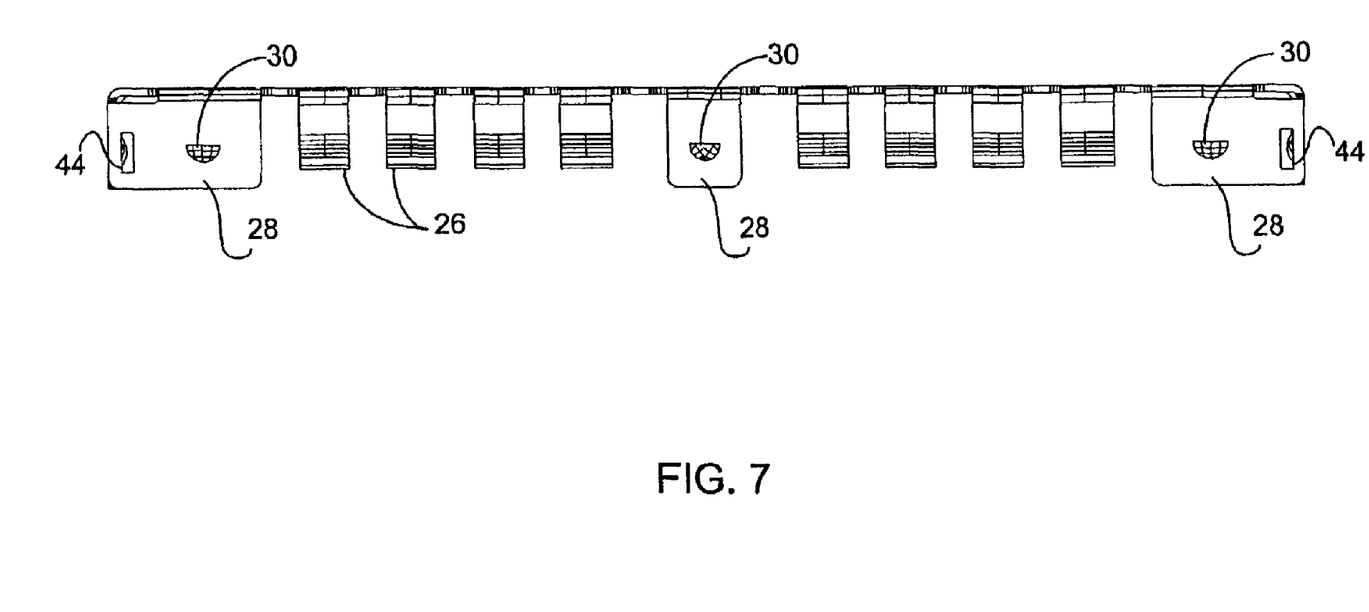
FIG. 7 is a side view of the cover of FIG. 6.

An embodiment of the cover 24 of the shielding device is shown in FIGS. 6 and 7. The cover 24 is rectangular in shape to correspond to frame 22 described generally above. As previously discussed with respect to the frame 22, the cover 24 may be configured in a shape other than rectangular. The cover 24 includes an upper surface 54 having a plurality of openings 34 formed therein, alignment members 28 configured for aligning and attaching the cover to the frame 22, and a plurality of spring members (fingers) 26 configured for engagement with sidewalls 38 of the frame.

The openings 34 are provided to allow for optical inspection of the printed circuit board and components thereon without having to remove the cover 24 from frame 22 after it is attached to the printed circuit board. The openings 34 are sized such that the dimension of each opening is smaller than a wavelength of the highest frequency of operation. For example, a shielding device 20 designed for use in an environment with about 1900 MHz frequency of operation has openings 34 with diameters less than 1.97 mm. The openings 34 are spaced to minimize the amount of material between the openings as defined by design constraints and in accordance with metal stamping process limitations. As shown in FIGS. 2 and 6, the openings 34 may be spaced on the upper surface 54 such that a central portion of the upper surface does not include any openings, to provide an interface for standard SMD pick-and-place technology equipment, for example. The number, size, shape, and arrangement of openings 34 may be different than shown herein without departing from the scope of the invention. For example, the openings may be arranged to cover the majority of the upper surface 54 as shown in U.S. patent application Ser. No. 09/967,777, filed Sep. 28, 2001.

The embodiment of the cover 24 shown in FIG. 2 includes twelve alignment members 28. Eight of the alignment members 28 are located at the corners of the cover 24 (two at each corner) and four alignment members are disposed at a central location along each edge of the cover. The alignment members 28 extend downwardly from the upper surface 54 at an angle of approximately 90 degrees. Each alignment member 28 includes a protrusion (or dimple) 30 formed by forcing a semi-circle shaped portion of the metal inwardly from a face of the alignment member. The protrusions 30 are shaped for insertion into the aligned openings 32 formed in the sidewalls 38 of the frame 22 (FIGS. 2 and 7). The semi-circle configuration of the projections 30 and corresponding openings 32 provide a positive mechanical attachment between the frame 22 and cover 24 and prevents the cover from being inadvertently released from the frame.

It is to be understood that the protrusions 30 may have shapes other than shown herein and the cover 24 may include a different number of alignment members 28 than shown herein. It is also to be understood that the projections may be formed on the frame 22 and the openings (alignment-receiving elements) 32 located on the cover 24.

Figure 5:
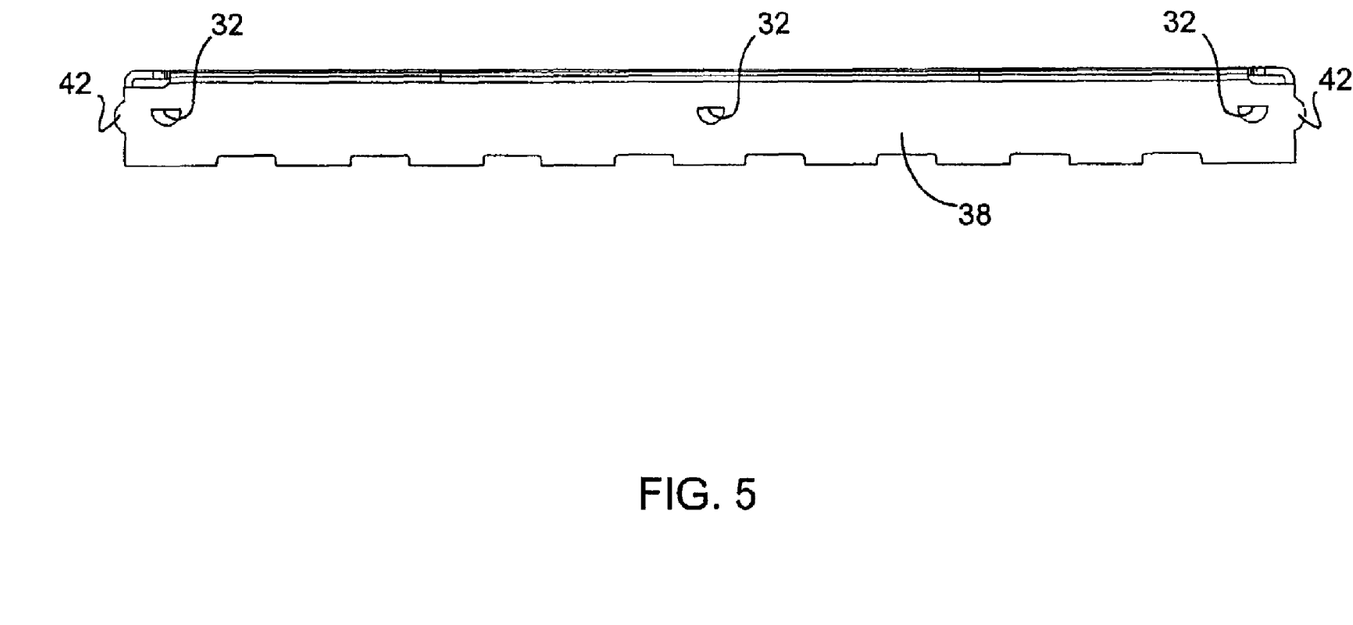
FIG. 5 is a second side view of the frame of FIG. 3.

One of the alignment members 28 disposed at each corner includes a slot 44 for insertion of the tab 42 located at each corner of the frame 22 (FIGS. 5 and 7). The tab and slot arrangement along with the two alignment member connections between the frame 22 and cover 24 provide three grounding contact points at each corner of the shielding device 20 to prevent radio frequency signal leakage.

The spring members 26 extend downwardly from the upper surface 54 at an angle of approximately 90 degrees. The members 26 are spaced such that the grounding contact points along an edge of the frame 22 and cover 24 are less than a wavelength of the highest frequency of operation to substantially minimize radio frequency signal leakage. Similarly, the spacing between the spring members 26 and adjacent alignment members 28 is less than a wavelength of the highest frequency of operation.

The spring members 26 each have an end portion 56 bent inwardly so that the member springingly engages the sidewall 38 of the frame 22 (FIGS. 1 and 2) The bend in the spring member 26 creates a bias of the member against the sidewalls 38 of the frame 22. The spring members 26 are designed to provide sufficient contact between the frame 22 and cover 24 without imparting high bending stress to the printed circuit board during removal and replacement of the cover (if required to rework the printed circuit board). The members 26 are preferably sized such that ends of the members are located at a distance from the lower edge of the frame sidewall 38 to prevent solder paste from connecting the cover to the frame (FIG. 1). For example, the spring members 26 may be sized to leave a gap of approximately 0.8 mm between the ends of the members and the lower edge of the frame sidewalls 38. It is to be understood that the number and shape of the spring members 26 ay be different than shown herein without departing from the scope of the invention. For example, the spring members 26 may be configured as shown in U.S. patent application Ser. No. 09/967,777 referenced above.

The frame 22 and cover 24 may be stamped from any suitable material that is electrically conductive to radio frequency signals. The material is also selected so that it can be soldered onto a printed circuit board for re-flow soldering. The material may be, for example, a metal alloy, such as copper-nickel-zinc ($CuNi_{18}Zn_{20}(F_{58})$).

The cover 24 is preferably attached to the frame 22 prior to attaching the shielding device 20 to a printed circuit board. After the assembled frame 22 and cover 24 are placed on the printed circuit board, the board and shielding device 20 are re-flow soldered along with all of the other components on the printed circuit board. Once the re-flow soldering operation is performed and the assembly is cleaned, the assembly may be optically inspected for proper parts placement and electrically tested. If all inspections and tests are passed, the finished assembly can go to final product assembly. If any optical inspection or electrical test fails, the cover 24 can be easily removed from the frame 22 and the printed circuit board reworked or repaired before replacing the cover. The spring and alignment members 26, 28 are designed to minimize removal and attachment forces on the frame 22 and printed circuit board. The projections 30 on cover 24 and openings 32 on frame 22 provide for proper alignment of the frame and cover.

Although the present invention has been described in accordance with the embodiments shown, one of ordinary skill in the art will readily recognize that there could be variations to the embodiments and these variations would be within the spirit and scope of the present invention. Accordingly, many modifications may be made by one of ordinary skill in the art without departing from the spirit and scope of the appended claims.

What is claimed is:

1. A device for providing radio frequency shielding, comprising:
    a frame configured to extend generally around the periphery of an electronic component, the frame comprising an upper wall, sidewalls depending from the upper wall and away from a central opening of the frame at an angle of at least approximately ninety-one degrees relative to the upper wall, and a plurality of stiffening flanges extending from the upper wall towards an interior portion of the frame; and
    a cover removably attached to the frame, the cover comprising an upper surface and a plurality of members extending therefrom for engagement with the sidewalls of the frame, whereby the cover and the frame form an enclosure for shielding the electronic component.

2. The device of claim 1 wherein the members are spaced to substantially prevent electromagnetic radio frequency energy from entering and leaving said enclosure between said members.

3. The device of claim 1 wherein the frame is formed from stamped metal.

4. The device of claim 1 wherein the frame is rectangular and at least one of the plurality of stiffening flanges are disposed along an edge of the frame.

5. The device of claim 4 wherein the stiffening flanges are disposed at a central portion of each edge of the frame.

6. The device of claim 4 wherein one of the stiffening flanges is disposed at a corner of the frame.

7. The device of claim 1 wherein the upper surface of the cover has a plurality of openings disposed to allow for inspection of the electronic component when the component is positioned within the device.

8. The device of claim 7 wherein said plurality of openings are generally round and have a diameter of a size to substantially prevent electromagnetic radio frequency energy from entering or leaving said openings.

9. The device of claim 1 wherein the stiffening flanges taper downwardly away from the upper wall.

10. The device of claim 1 wherein said plurality of members comprises spring members biased inwardly for engagement with the sidewalls of the frame.

11. The device of claim 10 wherein said plurality of members further comprises alignment members having a projection configured for insertion into an opening in the sidewall of the frame.

12. The device of claim 1 wherein said plurality of members terminate before reaching a lower edge of the frame sidewall when the cover is attached to the frame.

13. The device of claim 1, wherein:
   the cover further comprises a plurality of alignment members located at corners of the cover;
   and whereby the cover and the frame have at least two grounding contact points at each of the corner interfaces between the frame and the cover.

14. A device for providing radio frequency shielding, comprising:
   a frame configured to extend generally around the periphery of an electronic component, the frame comprising an upper wall, sidewalls depending therefrom, and a plurality of stiffening flanges extending from the upper wall towards an interior portion of the frame, the stiffening flanges extending downwardly from the upper wall at an angle less than 20 degrees relative to the upper wall; and
   a cover removably attached to the frame, the cover comprising an upper surface and a plurality of members extending therefrom for engagement with the sidewalls of the frame, whereby the cover and the frame form an enclosure for shielding the electronic component.

15. The device of claim 14 wherein the stiffening flanges extend downwardly from the upper wall at an angle of approximately 15 degrees relative to the upper wall.

16. The device of claim 14 wherein the members are spaced to substantially prevent electromagnetic radio frequency energy from entering and leaving said enclosure between said members.

17. The device of claim 14 wherein the frame is rectangular and at least one of the plurality of stiffening flanges are disposed along an edge of the frame.

18. The device of claim 17 wherein the stiffening flanges are disposed at a central portion of each edge of the frame.

19. The device of claim 14 whereby the cover and the frame form an enclosure for shielding the electronic component and have at least two grounding contact points at each of the corner interfaces between the frame and the cover.

20. The device of claim 19 wherein at least one of the sidewalls has a tab at an end portion thereof and at least one of said plurality of alignment members has an opening sized for receiving the tab, wherein the tab and the opening form one of the grounding contact points.

21. The device of claim 19 wherein one of the cover alignment member and frame sidewall has an alignment-receiving element and the other of the alignment member and the frame sidewall has a projection sized for insertion into the alignment-receiving element, the projection and the alignment receiving element forming one of the grounding contact points.

22. The device of claim 21 wherein the alignment member comprises the projection and the frame sidewall comprises the alignment-receiving element.

23. The device of claim 22 wherein the alignment-receiving element is an opening extending through the frame sidewall.

24. The device of claim 23 wherein said opening and the projection have a semi-circle shape.

25. The device of claim 14 whereby the cover and the frame form an enclosure for shielding the electronic component and have at least three grounding contact points at each of the corner interfaces between the frame and the cover.

26. The device of claim 14 wherein the sidewalls depend from the upper wall away from a central opening of the frame at an angle of at least approximately ninety-one degrees relative to the upper wall.

* * * * *